United States Patent
Guha et al.

(10) Patent No.: US 7,847,222 B2
(45) Date of Patent: Dec. 7, 2010

(54) HEATER AND MEMORY CELL, MEMORY DEVICE AND RECORDING HEAD INCLUDING THE HEATER

(75) Inventors: Supratik Guha, Chappaqua, NY (US); Hendrik F. Hamann, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1293 days.

(21) Appl. No.: 11/387,873

(22) Filed: Mar. 24, 2006

(65) Prior Publication Data

US 2010/0103721 A1 Apr. 29, 2010

(51) Int. Cl.
*H05B 3/10* (2006.01)
*G11C 11/00* (2006.01)

(52) U.S. Cl. ............... 219/553; 219/543; 219/538; 219/522; 219/535; 219/542; 392/480; 365/163

(58) Field of Classification Search ............... 219/553, 219/543, 538, 522, 535, 542; 392/480; 365/163
See application file for complete search history.

(56) References Cited

U.S. PATENT DOCUMENTS

| | | | |
|---|---|---|---|
| 6,072,165 A | * | 6/2000 | Feldman ............... 219/543 |
| 6,233,206 B1 | | 5/2001 | Hamann et al. |
| 6,433,310 B1 | | 8/2002 | Wickramasinghe et al. |
| 6,532,125 B1 | | 3/2003 | Hamann et al. |
| 6,597,639 B1 | | 7/2003 | Hamann et al. |
| 2004/0188668 A1 | | 9/2004 | Hamann et al. |

OTHER PUBLICATIONS

"Atomic force microscope cantilevers for combined thermomechanical data writing and reading", W.P. King, T.W. Kenny, K.E. Goodson, G. Cross, M. Despont, U. During, H. Rothuizen, G.K. Binning, and P. Vettiger, Appl. Phys. Lett. 78, 1300 (2001).

* cited by examiner

*Primary Examiner*—Shawntina Fuqua
(74) *Attorney, Agent, or Firm*—Vazken Alexanian; McGinn IP Law Group, PLLC

(57) ABSTRACT

A heater includes at least two leads, and a heating element which is formed between the at least two leads, a material of the heating element being different from a material of the at least two leads such that a location of a hot spot in the heater is controllable based on a polarity of current in the heater.

10 Claims, 9 Drawing Sheets

FIG. 6A  FIG. 6B

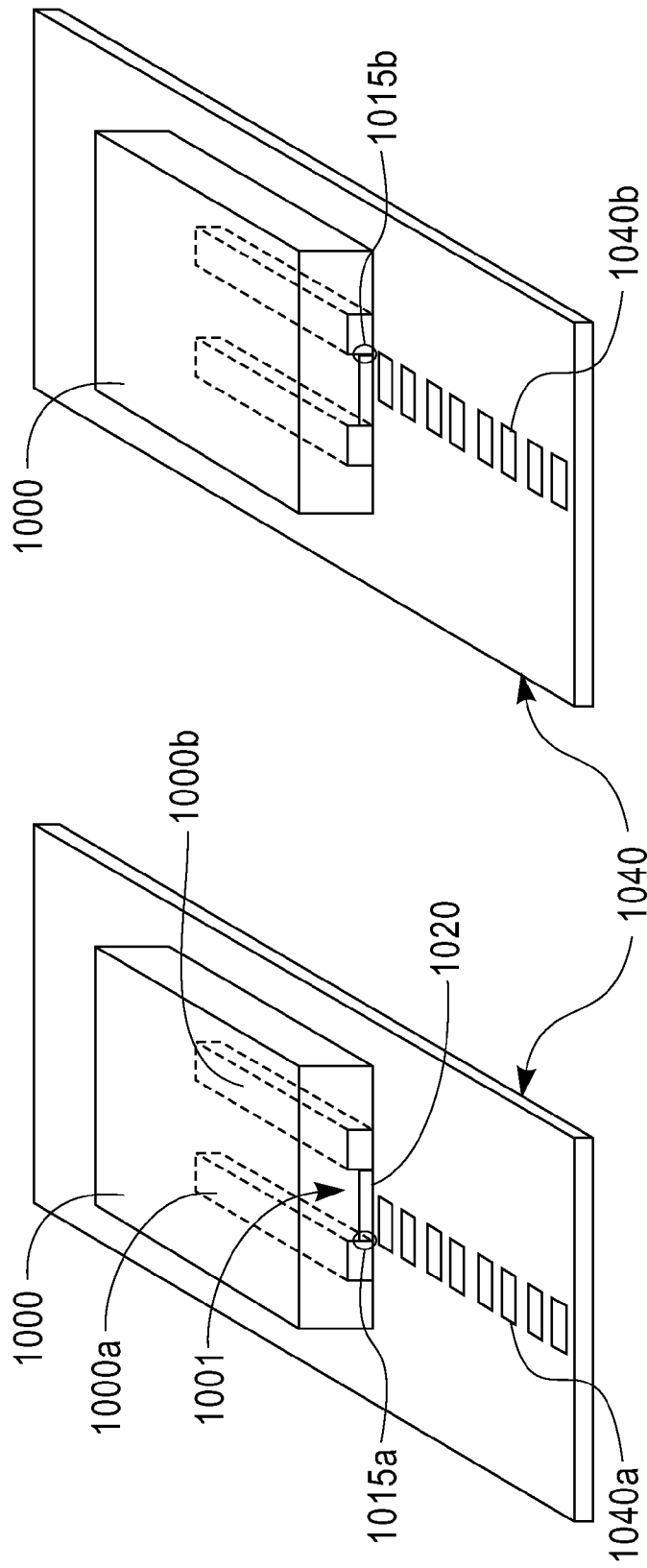

HEATER AND MEMORY CELL, MEMORY DEVICE AND RECORDING HEAD INCLUDING THE HEATER

BACKGROUND OF THE INVENTION

1. Field of the Invention

The present invention relates to a heater, and more particularly, to a heater in which a material of the heating element is different from a material of the leads such that a location of a hot spot in the heater is controllable based on a polarity of current in the heater.

2. Description of the Related Art

The importance of nanoheaters and/or nanoscale thermal transducers for local heat delivery has been realized for magnetic thermal recording, ferroelectric thermal recording, phase-change recording and reading, and thermal memory (e.g., see U.S. Pat. Nos. 6,532,125, 6,233,206, 6,597,639 and 6,433,310, and U.S. Patent Publication No. US20040188668A1, all of which are commonly assigned to the present assignee and are incorporated by reference herein).

The importance of nanoheaters and/or nanoscale thermal transducers for local heat delivery has also been realized for thermo-mechanical storage applications (e.g., "Atomic force microscope cantilevers for combined thermomechanical data writing and reading", W. P. King, T. W. Kenny, K. E. Goodson, G. Cross, M. Despont, U. Dürig, H. Rothuizen, G. K. Binnig, and P. Vettiger, Appl. Phys. Lett. 78, 1300 (2001)).

One of the key challenges in the use of nanoheaters and/or nanoscale thermal transducers for local heat delivery is the control of the location and the spatial extent of the resulting hot spot. More specifically, U.S. Patent Publication No. US20040188668A1, discloses a small nanoheater which is used to program a thermal and/or electrical impedance of a storage material, which is part of a memory cell. This small nanoheater provided some control of the location and the spatial extent of the resulting hot spot. However, it is desired to further improve such control.

SUMMARY OF THE INVENTION

In view of the foregoing and other exemplary problems, disadvantages, and drawbacks of the aforementioned systems, devices and methods, it is a purpose of the exemplary aspects of the present invention to provide a heater having a heating element, a material of the heating element being different from a material of the at least two leads such that a location of a hot spot in the heater is controllable based on a polarity of current (e.g., electrical current) in the heater.

In an exemplary aspect of the present invention, a heater includes at least two leads, and a heating element which is formed between the at least two leads, a material of the heating element being different from a material of the at least two leads such that a location of a hot spot in the heater is controllable based on a polarity of current in the heater (e.g., electrical current applied to the at least two leads).

In another exemplary aspect of the present invention, a method of fabricating a heater includes forming at least two leads, and forming a heating element between the at least two leads, a material of the heating element being different from a material of the at least two leads such that a location of a hot spot in the heater is controllable based on a polarity of current in the heater (e.g., electrical current applied to the at least two leads).

In another exemplary aspect of the present invention, a memory cell or information storage device includes at least one heater including at least two leads, and a heating element which is formed between the at least two leads, a material of the heating element being different from a material of the at least two leads such that a location of a hot spot in the heater is controllable based on a polarity of current in the heater, and at least one storage medium formed adjacent to the at least one heater.

In another exemplary aspect of the present invention, a memory device includes a plurality of memory cells according to the exemplary aspects of the present invention, and a current source electrically coupled to the plurality of memory cells, for generating the current in the heater, the current including a first current and a second current have a polarity which is reversed from the first current.

In another exemplary aspect of the present invention, a recording head for a information storage device includes at least one heater including at least two leads, and a heating element which is formed between the at least two leads, a material of the heating element being different from a material of the at least two leads such that a location of a hot spot in the heater is controllable based on a polarity of current in the heater (e.g., electrical current applied to the at least two leads).

BRIEF DESCRIPTION OF THE DRAWINGS

The foregoing and other exemplary purposes, features, aspects and advantages will be better understood from the following detailed description of the exemplary embodiments of the invention with reference to the drawings, in which:

FIGS. 6A-6D illustrate a memory cell 600, according to the exemplary aspects of the present invention;

FIGS. 10A and 10B illustrate a recording head 1000 (e.g., thermal recording head) for an information storage device, according to another exemplary aspect of the present invention.

DETAILED DESCRIPTION OF THE EXEMPLARY EMBODIMENTS OF THE INVENTION

Figure 1:
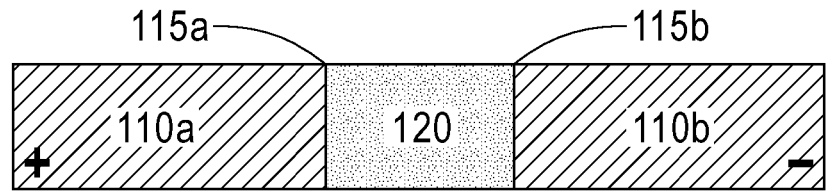
FIG. 1 illustrates a heater 100 for a memory cell, according to the exemplary aspects of the present invention.

Referring now to the drawings, FIGS. 1-10B illustrate the exemplary aspects of the present invention.

FIG. 1 illustrates a heater 100, which could be used in a memory cell or information storage device (e.g., harddisk drive, CD-Rom drive, DVD drive etc.) in accordance with the exemplary aspects of the present invention. The heater 100 includes at least two leads 110a and 110b (e.g., a pair of leads), and a heating element 120 which is formed adjacent to the leads (e.g., between the at least two leads). Further, an interface 115a may exist between the heating element 120 and the lead 110a, and another interface 115b may exist between the heating element 120 and the lead 110b.

Importantly, a material of the heating element 120 may be different from a material of the leads 110a, 110b such that a location of a hot spot in the heater 100 is controllable based on a polarity of current in the heater 100 (e.g., electrical current applied to leads 110a, 110b).

For example, a hot spot may be formed near an interface (e.g., 115a, 115b) between the heating element 120 and the leads 110a, 110b. Whether the hot spot is formed near interface 115a or interface 115b may be controllable (e.g., controlled) based on a polarity of current in the heater 100. That is, a plurality of hot spots (e.g., a pair of hot spots) could be selectively formed, and the locations of the plurality of hot spots may be controllable based on a polarity of current in the heater (e.g., the polarity of current applied to the leads).

It should be noted that the term "hot spot" may refer to a heatable region within the heater structure (e.g., in the heating element 120 and/or the leads 110a, 110b). Further, the term "hot spot" may include a region of heat generation (e.g., the heating element 120 which generates Joule heat) or a region, such as a region in the leads which is some distance from the lead/heating element interface, where heat is not necessarily generated, but which is conducting heat that has been generated near the interface. Generally, the hot spot of the heater structure may include (e.g., may be) the hottest region of the heater structure and can include the leads.

Figure 3A:
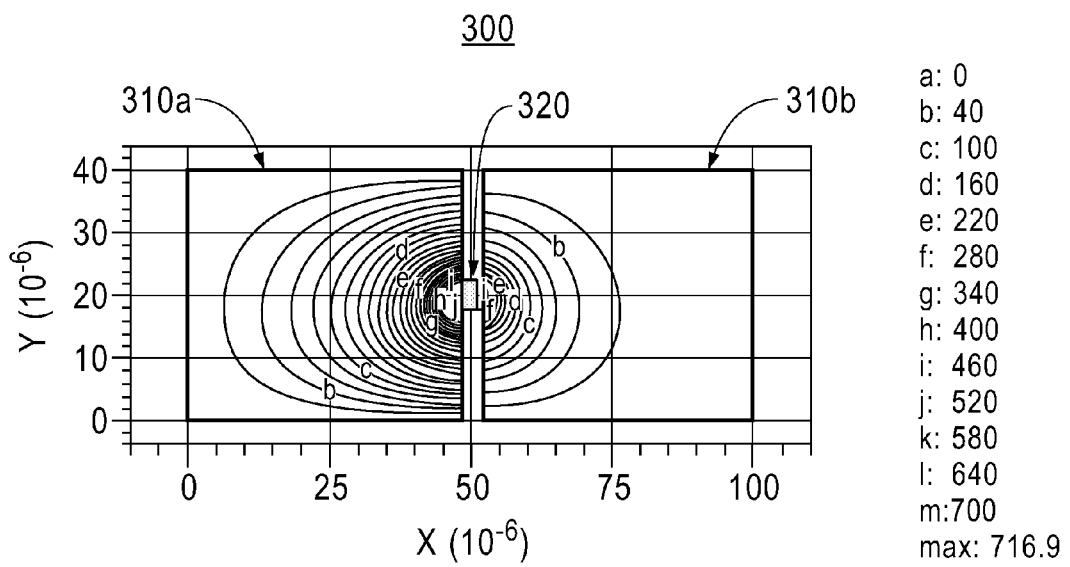
FIG. 3A illustrates some steady state temperature distribution profiles which were calculated for a heater (e.g., freestanding silicon-heater) with thermoelectric source terms

Further, the term "near an interface" may be construed to include at least an area of the heating element and leads which bounds the interface, and the area of the heating element and leads immediately adjacent thereto. Although (e.g., as illustrated in FIG. 3A), the hot spot may also extend into the lead a significant distance away from the interface with the heating element.

The present invention may offer an interesting feature by introducing an arrangement and a method for moving the location of the hot spot within the heater structure. For example, using the present invention it may be possible to realize more than one location of a hot spot (e.g., two or more hot spots in different locations) with only one heater.

It should be noted that the actual the hot spot (e.g., the location of the hot spot) may be governed by the heat generation pattern in the heater which may be quite complicated. That is, the heating element generates Joule heat. In addition, as noted below, Thomson and Peltier effects may be utilized to create a region (e.g., a region in the heating element and/or leads which generates heat and another region which depletes heat (e.g., cool). The net effect of these three different effects is that the hot spot can be in different locations within the heater structure (e.g., the leads and/or the heating element) depending on the current direction.

That is, although no significant Joule heat (e.g., resistive heat) is typically generated in the leads, the Joule heat generated in the heating element may conduct into the leads, and this heat may combine with heat generated and/or depleted at an interface between the heating element and leads by the Peltier effects and/or the Thompson effects, such that a portion of a lead near the interface with the heating element may serve as a hot source (e.g., as discussed below with respect to FIGS. 3A and 3B) for performing an operation such as reading data from, erasing data from, and writing data to a thermal storage medium.

That is, the "hot spot" may include an area in the heater which is heatable to a temperature sufficient to perform an operation such as reading data from, erasing data from, and writing data to a phase-change storage medium. For example, assuming that a phase-change material in the storage medium has a phase-change temperature of 600° C., the hot spot may include an area which is heatable to at least 600° C.

In the present invention, a thermal memory (e.g., a thermal memory as described in U.S. Patent Publication No. US20040188668A1) with one heater could be used to store two or more bits (e.g., one bit per hot spot with one heater). Furthermore, a recording head (e.g., a thermal phase-change recording head) as described in U.S. Pat. No. 6,433,310 with one heater could be used to read and/or write and/or erase (e.g., simultaneously read and/or write and/or erase) a plurality of tracks (e.g., one track per hot spot with one heater).

Further, the present invention demonstrates that a location of the hot spot can be moved (e.g., moved by a controlled distance) using different heating element properties and/or lead properties. In its most basic form, the present invention may exploit the current direction to move a location of the hot spot from one end of a heating element to another end of a heating element.

The inventive arrangement may include at least two materials with different Seebeck coefficients. For example, as illustrated in FIG. 1, a resistive heater 100 may be realized by different doping levels in a thin semiconductor (e.g., silicon) stripe, which may be part of a semiconductor wafer (e.g., silicon wafer, silicon-on-insulator (SOI) wafer, etc.).

In the example of FIG. 1, the leads 110a, 110b may include highly-doped (e.g., low resistivity) semiconductor while the heating element 120 may include lightly-doped (e.g., high resistivity) semiconductor. As it is clear, simple Joule heating considerations may result into symmetric heating profile which peaks near the middle portion (e.g., about equidistant between the lead/heating element interface) of the heating element 120. However, the present invention may realize that despite the contribution of the Joule heating, thermoelectric effects can be sufficiently strong enough to change significantly the shape of the heating profile and thus move the resulting hot spot based on the current direction.

More specifically, the present invention may realize that the different doping levels (e.g., the leads having a dopant concentration which is different from a dopant concentration of the heating element) can result into a substantial Peltier heat. Further, the strong temperature gradient throughout the heating element 120, which is caused by the Joule and the Peltier heat, may result in additional Thomson heat.

Both Peltier heat and Thomson heat are proportional to the current density. Peltier and Thomson effects are caused by variations in the Seebeck coefficient. In the case of Peltier effect, the local variation in the Seebeck coefficient may be due to doping level differences and/or different material properties. In the case of the Thomson effect, the local variation is due to the temperature gradient provided that the Seebeck coefficient is temperature dependent.

Figure 2A:
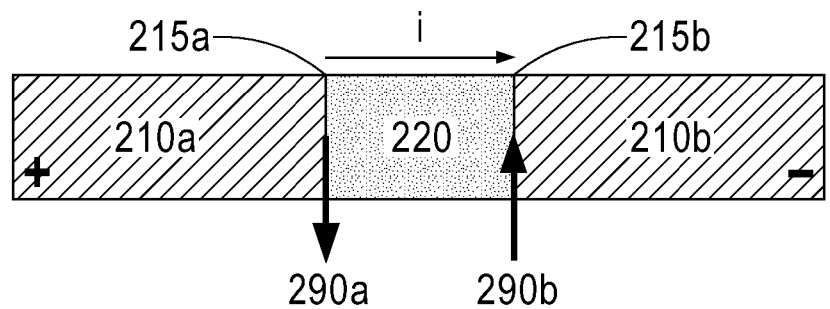
FIGS. 2A and 2B illustrate the Peltier and Thomson effects, respectively, in an exemplary heater 200, according to the exemplary aspects of the present invention.
Figure 2B:
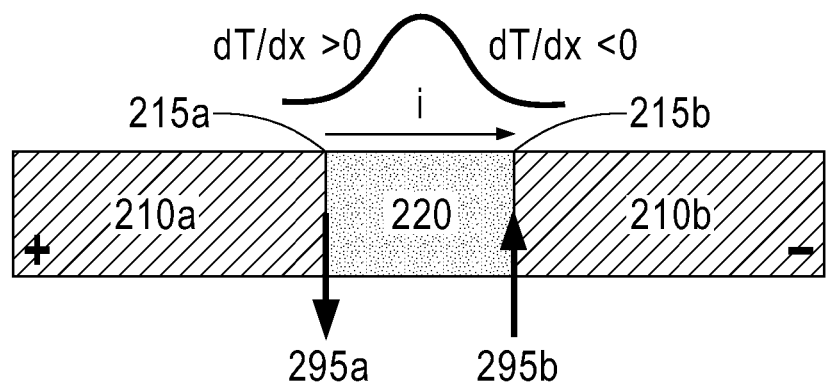

Thus, if an electric current is applied to the heating element 120 (e.g., resistive heater) in FIG. 1, heat may be moved from one portion of the heating element to another portion of the heating element. FIGS. 2A and 2B illustrate the Peltier and Thomson effects, respectively, in an exemplary heater 200 which includes leads 210a, 210b and a heating element 220.

As is clear from FIGS. 2A and 2B, where the Seebeck coefficient of a material in the heating element 220 is different from the Seebeck coefficient of a material in the leads 210a, 210b (e.g., for a heating element material Seebeck coefficient $(S_h)$ of about −3.6 mV/K, and a lead material Seebeck coefficient $(S_l)$ of about −5.1 mV/K), heat may be removed on the left side and released on right side of the heating element 220 if the current, i, is applied from left to right. However, if the current, i, is changed (e.g., applied in an opposite direction) the heat may be removed near the right side of the heating element 220 and released near the left side of the heating element 220.

That is, in the present invention a direction of the electrical current can be exploited to alter the heat distribution within the heater. As illustrated in FIG. 2A, the Peltier effect results in heat removed 290b on the right side of the heating element 220 (e.g., near interface 215b) in the amount of +iT $(S_h-S_l)$ and heat released 290a on the left side of the heating element 220 (e.g., near interface 215a) in the amount of −iT $(S_l-S_h)$, where i is the current (mA), T is the temperature (K), $S_h$ is the Seebeck coefficient (mV/K) for a material in the heating element 220, and $S_l$ (mV/K) is the Seebeck coefficient for a material in the leads 210a, 210b. As illustrated in FIG. 2B, the Thompson effect results in heat removed 295b on the right side of the heating element 220 in the amount of +i (T $dS_{hl}/dT$)(dT/dx) and heat released 295a on the left side of the heating element 220 in the amount of +i (T $dS_{hl}/dT$)(dT/dx).

On a more quantitative level, the Poission equation $\nabla(-\sigma\nabla U)=0$ and the heat conduction equation $\nabla(-k\nabla T)-\sigma(\nabla U)^2-|j|T\nabla S-|j|(T\ dS/dT)\nabla T=0$ for the heater of the present invention (e.g., the exemplary heater 200 illustrated in FIGS. 2A, 2B), may be solved simultaneously using finite element techniques, where $\nabla$ is the Laplace operator, a is electrical conductivity, U is the voltage, k is the thermal conductivity, T the temperature, j the current density and S the Seebeck coefficient. The last three terms in the heat conduction equation represent the source terms, specifically the Joule heat, the Peltier heat and Thomson heat, respectively.

Figure 3B:
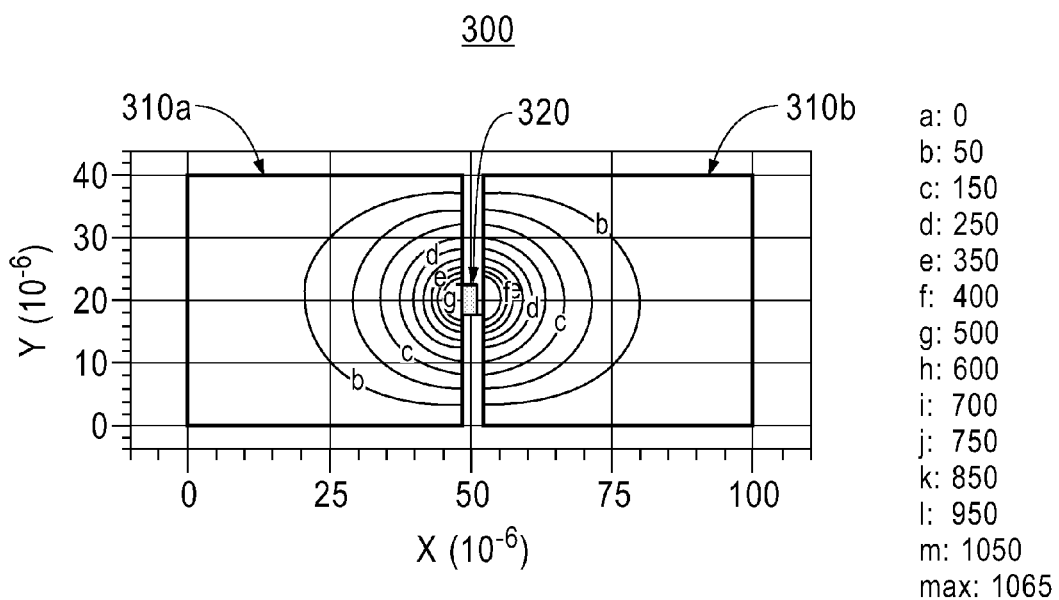
FIG. 3B illustrates some steady state temperature distributions which were calculated for a heater (e.g., free-standing silicon-heater) without thermoelectric source terms.

FIG. 3A illustrates some steady state temperature distribution profiles which were calculated using the above mentioned equations for a heater (e.g., free-standing silicon-heater) with thermoelectric source terms, and FIG. 3B illustrates some steady state temperature distributions which were calculated for a heater (e.g., free-standing silicon-heater) without thermoelectric source terms. The impact of a strong thermoelectric effect even in the presence is quite clear from the calculated profiles which are illustrated in FIGS. 3A and 3B.

The exemplary temperature distribution profiles illustrated in FIGS. 3A and 3B were measured by the inventors in a device in which the thickness of the silicon membrane was about 0.5 microns, the heating element size was about 3.5 microns×about 2 microns, the leads were highly doped (e.g., about $10^{20}$ cm$^{-3}$) while the heating element was slightly doped (e.g., about $10^{17}$ cm$^{-3}$) (e.g., see FIGS. 2A, 2B). The dopant atoms implanted in the heating element and leads of the present invention may include, for example, phosphorus ions.

Specifically, FIGS. 3A and 3B depict the steady state temperature distribution profiles in the heater 300 having leads 310a, 310b and a heating element 320. The x-axis is the length (in microns) of the heater 300 and the y-axis is the width (in microns) of the heater 300 which was modeled using the above equations. The contour lines (e.g., a, b, c, etc.) are lines of equal temperature in the leads 310a, 310b (e.g., outside of the heating element 320 used in the model). The column to the right of the heater 300 in FIGS. 3A and 3B indicates the temperature increase (K) for the respective contour lines. It should be noted that contour lines k, l, and m which are noted in the column, are in such close proximity to the interface that they could not be clearly illustrated in FIGS. 3A and 3B.

FIG. 3A illustrates that the hot spot may extend in the lead 310a a significant distance away from the interface with the heating element. Further, unlike the heating profile without considering thermoelectric effects (e.g., Peltier and Thompson effects) in FIG. 3B which is substantially symmetrical in leads 310a and 310b, the heating profile with considering thermoelectric effects in FIG. 3A is clearly not symmetrical. Indeed, for example, contour line "b" which represents a 40K increase in temperature may be located in lead 310a about 35 microns or more from the interface with the heating element 320, whereas in lead 310b, contour line "b" may extend no further than about 15 microns away from the interface with the heating element 320. That is, due at least in part to the thermoelectric effects, the heat spot may extend into lead 310a a distance which is at least two times the distance that the heat spot extends in lead 310b.

Thus, a hot spot may be located in a lead (e.g., a portion of a lead near the interface between the lead and heating element). This may allow the claimed invention to provide a significant distance between the locations on the heater that may be used as a heat source (e.g., for performing reading, writing and/or erasing of data, etc.).

Further, as illustrated in FIG. 3A, it is important to note that the "hot spot" may not be the only portion of the heater that sees an increase in temperature when an electrical current is applied to the leads. However, the "hot spot" may be the only portion of the heater that sees an increase in temperature which is sufficient to perform reading, writing and/or erasing of data from a thermal storage medium.

For example, if it is imagined that the heater 300 in FIG. 3A is overlayed onto a phase-change storage medium, and the storage medium requires a temperature increase of about 520K to change phase, and if an electrical current is applied to the heater 300 as indicated in FIG. 3A, only the portion of the storage medium near the interface between lead 310a and the heating element may experience a phase change, since that is the only portion of the heater 300 that reaches that temperature (e.g., note that contour line "j" may be located in lead 310a, but not located in lead 310b).

The heating element and/or lead material should preferably include semiconductors because these materials have large Seeback coefficients. The dopant atoms (e.g., dopant ions) may include an n-type dopant or a p-type dopant such as phosphorous or boron. The difference in dopant concentrations between the heating element and the leads may be on the order of several orders of magnitudes. The heater dimensions may be quite flexible. In most applications the dimensions may be small (e.g., less than about one micron) in order to achieve high bit densities. The aspect ratio between width and length (e.g., length in the direction of the current) of the heater should be greater than 1.

Experiments

The inventors have performed experiments and generated some experimental data which supports their calculations with respect to the present invention. The experimental data clearly shows that by choosing the appropriate lead and heater materials the hot spot can be moved by the heater size depending on the polarity of the heating current.

Figure 4A:
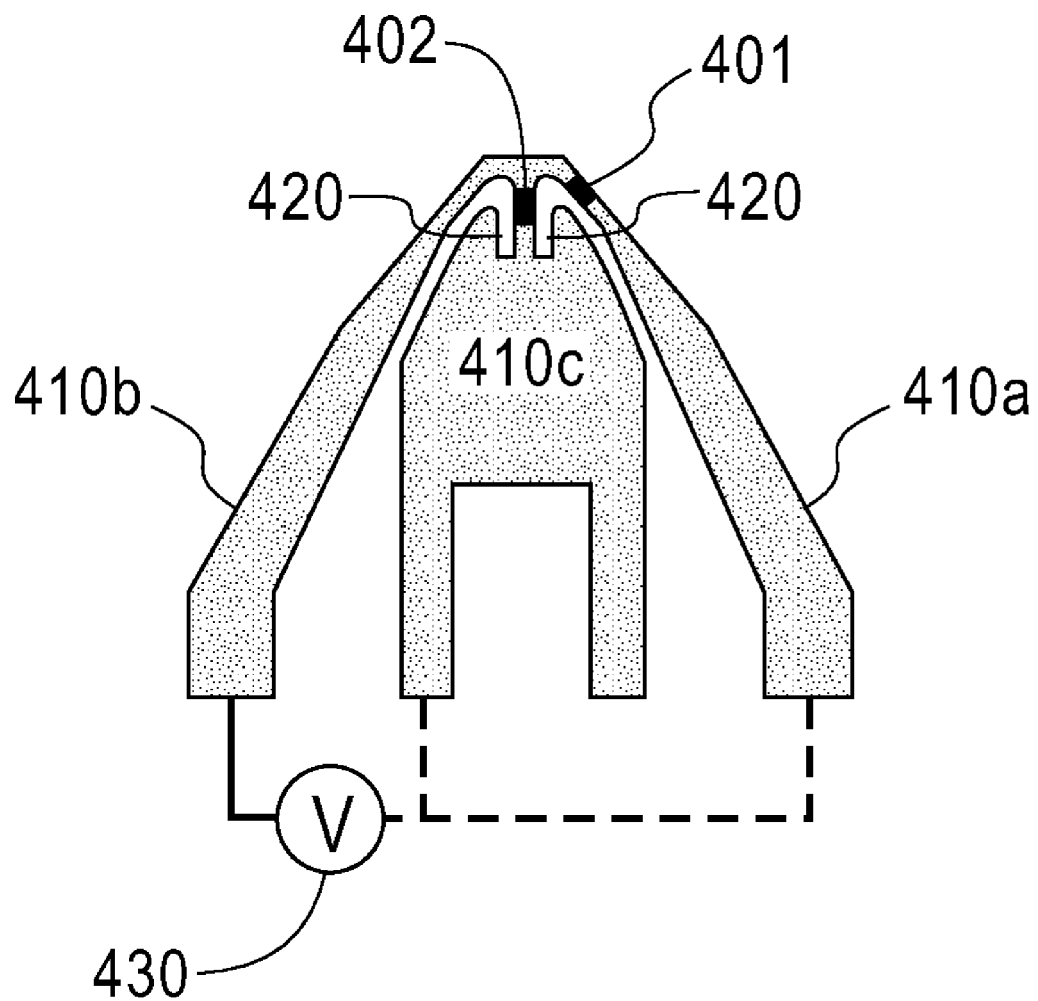
FIG. 4A illustrates a free standing silicon membrane test structure 400, which includes a pair of heaters 401, 402, according to the exemplary aspects of the present invention.

FIG. 4A illustrates a free standing silicon membrane test structure 400 which includes a pair of heaters 401, 402 according to an exemplary aspect of the present invention, and which the inventors used to conduct experiments. The structure 400 included a silicon membrane which was about 0.5 microns thick and had formed therein leads 410a, 410b, 410c, and first and second heating elements 420, which were defined by applying different dopant levels to the silicon membrane. That is, the first heater 401 included heating element 420 formed between leads 410a and 410b, and the second heater 402 included heating element 420 formed between leads 410b and 410c. That is, the first and second heaters 401, 402 shared the lead 410b in this exemplary aspect.

The heating elements 420 each had a length of about 3.5 microns and a width of about 2 microns. As in the calculations above, the leads 410a, 410b, 410c were doped with about $10^{20}$ cm$^{-3}$ dopant atoms, and the first and second heating elements 420, were doped and about $10^{17}$ cm$^{-3}$ dopant atoms.

As shown in FIG. 4A, the heaters 401, 402 were connected to a voltage source 430 (e.g., a current source) to selectively apply a current of either polarity to the first and second heaters 401, 402 in the silicon membrane. Specifically, in one instance, the voltage source 430 was connected to the leads 410a and 410b (e.g., connected to the silicon membrane) to apply a current to the first heater 401, and in another instance, was connected to the leads 410b and 410c (e.g., connected to the silicon membrane) to apply a current to the second heater 402.

Figure 4B:
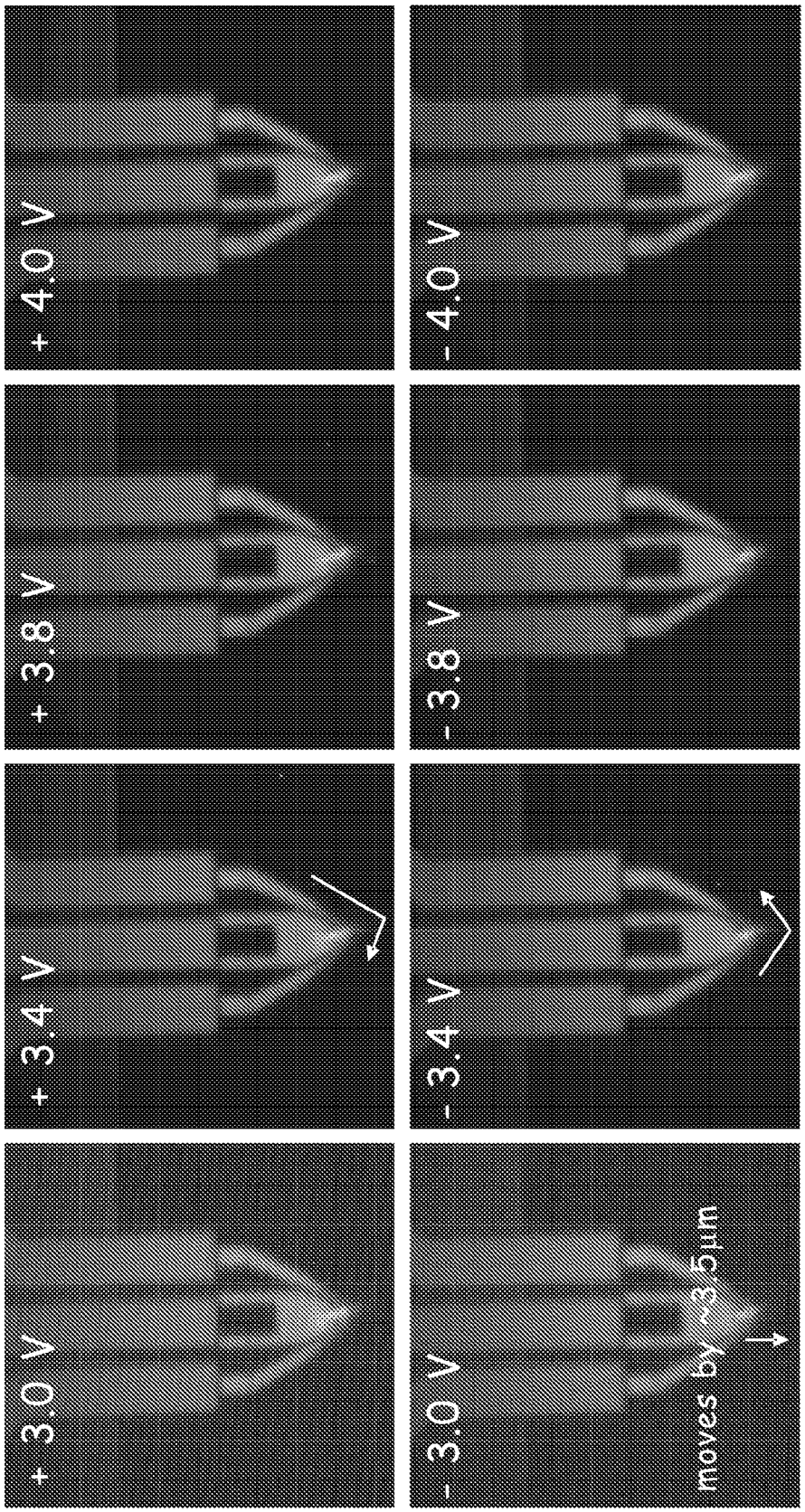
FIG. 4B provides eight photographs which illustrate the experimental results of the measured temperature distribution for various voltages for heater 401 using both polarities of current.
Figure 4C:
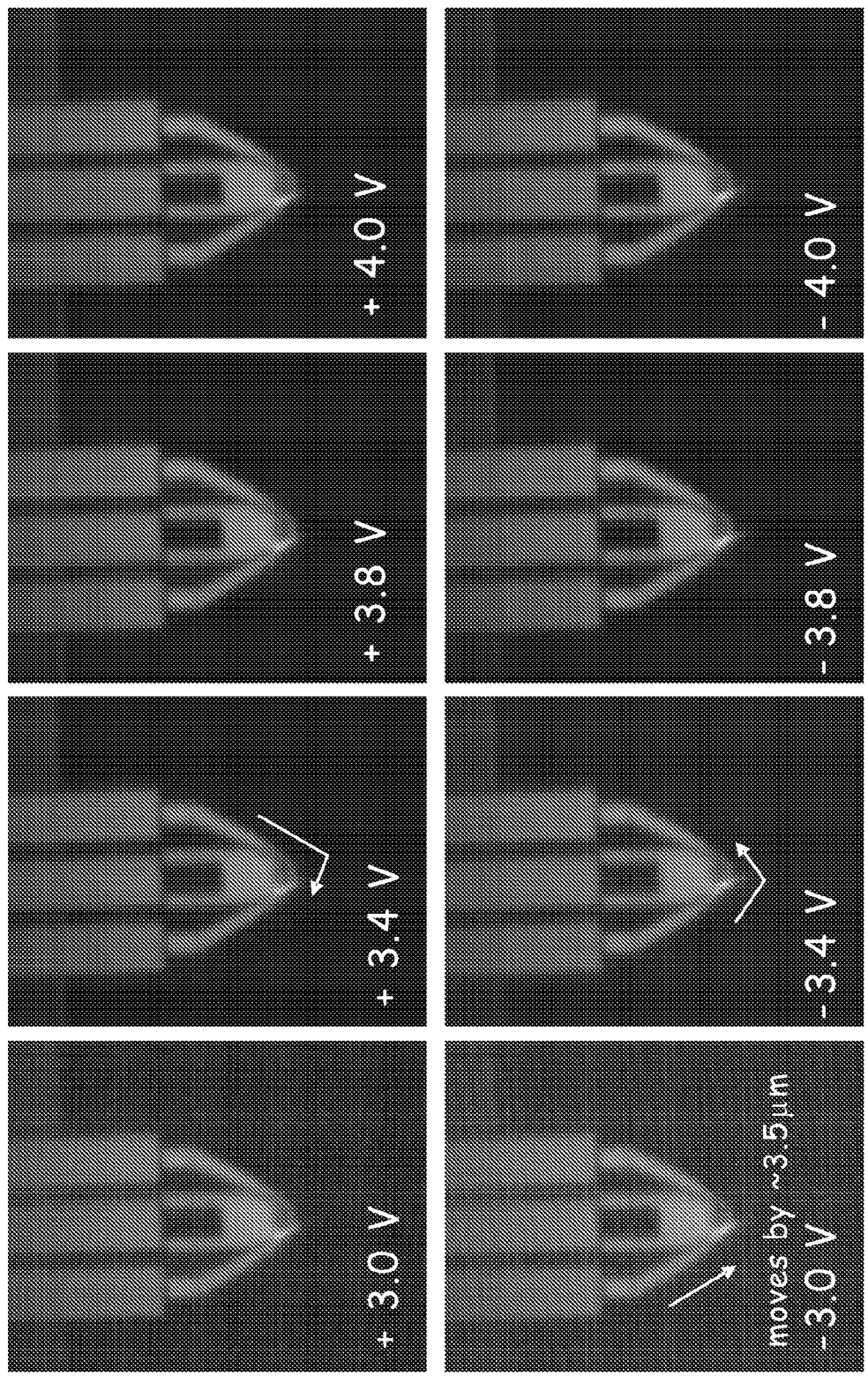
FIG. 4C provides eight photographs which illustrate the experimental results of the measured temperature distribution for various voltages for heater 402 using both polarities of current.

FIG. 4B provides eight photographs which illustrate the experimental results of the measured temperature distribution for various voltages for heater 401 using both polarities of current, and FIG. 4C provides eight photographs which illustrate the experimental results of the measured temperature distribution for various voltages for heater 402 using both polarities of current. The temperature distribution in the test structure 400 was measured using a single photon counting charge-coupled device (CCD) camera. The resolution of the photographs in FIGS. 4B and 4C is approximately 1 micron. The amount of voltage (e.g., current) applied to the heaters 401, 402 (e.g., +3.0V, +3.4V, etc) is indicated in each of the drawings, and the direction of current, I, in the heaters 401, 402 is indicated by an arrow.

The experimental data (e.g., the temperature distribution data illustrated in FIGS. 4B and 4C) shows clearly that the hot spot can be controlled in the heater and heating elements 420 in the direction of the current, I, which is consistent with the calculations illustrated in FIGS. 3A and 3B. The experimental data also demonstrates that the displacement hot spot movement may be independent of the applied voltage/current.

Figure 4D:
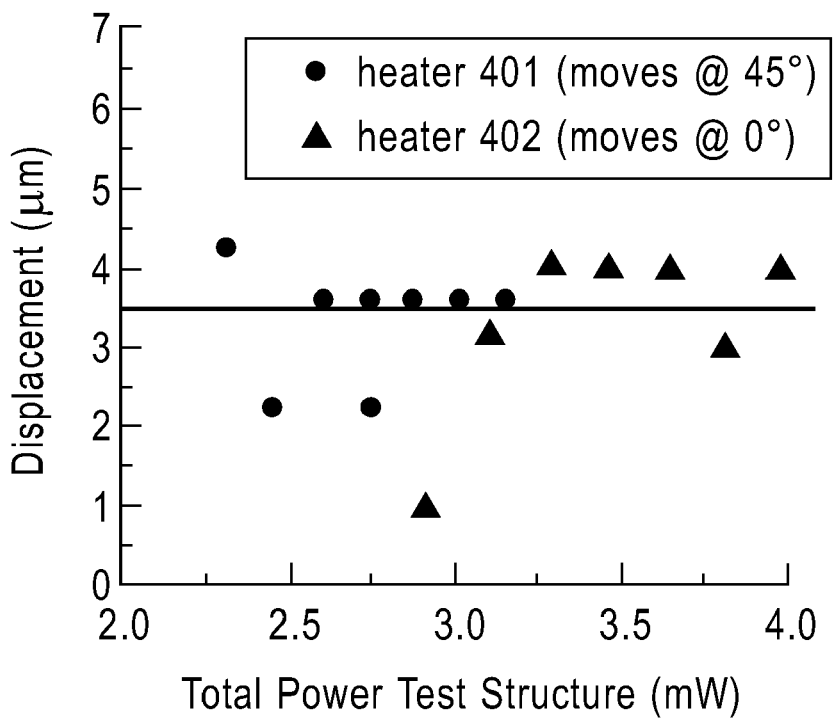
FIG. 4D provides a graph which plots the distance of the hot spot movement (e.g., displacement in microns) as a function of the applied power to a heater test structure (e.g., total power test structure (e.g., lever) in mW)

For example, FIG. 4D provides a graph which plots the distance of the hot spot movement (e.g., displacement in microns) as a function of the applied power to the heater test structure (e.g., total power test structure (e.g., lever) in mW). Although there is some noise the data, the graph in FIG. 4D clearly demonstrates that the displacement of the hot spot movement may be independent of the applied power, and that the distance of the heat spot movement may correspond (e.g., at least substantially correspond) to the length of the heating element. For example, in this exemplary aspect, the heat spot moved about 3 to 4 microns which is about the length (e.g., 3.5 microns) of the heating element.

Other Exemplary Aspects

Figure 5:
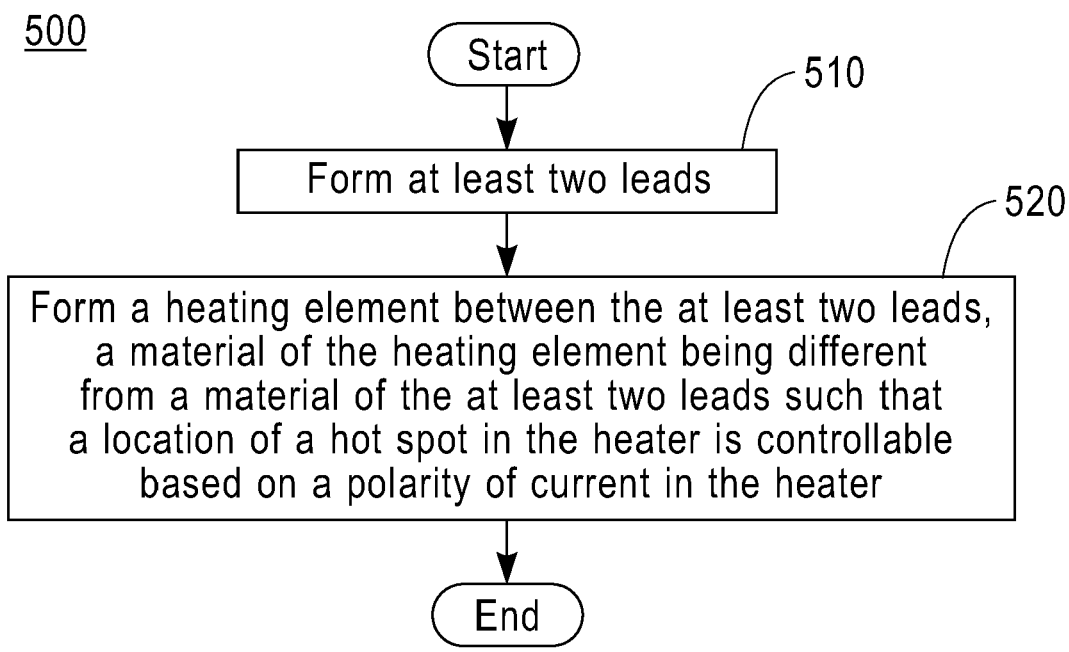
FIG. 5 illustrates a method 500 of fabricating a heater for a memory cell, according to the exemplary aspects of the present invention.

FIG. 5 provides a flowchart illustrating another exemplary aspect of the present invention. Specifically, FIG. 5 illustrates a method 500 of fabricating a heater, which could be used for a memory cell or information storage device, according to the exemplary aspects of the present invention. The method 500 includes forming (510) at least two leads, and forming (520) a heating element between the at least two leads, a material of the heating element being different from a material of the at least two leads such that a location of a hot spot in the heater is controllable based on a polarity of current in the heater.

More specifically, the leads may include a first material and the heating element a second material having a Seebeck coefficient which is different than a Seebeck coefficient of the first material. For example, the first and second materials may be formed using the same semiconductor membrane (e.g., a silicon membrane having a thickness of about 0.5 microns), but the first material may be formed by doping the membrane to a first dopant concentration and the second material may be formed by doping the membrane to a second dopant concentration which is different than the first concentration. That is, the dopant concentration in the leads (e.g., the first material) may be greater than the dopant concentration in the heating element (e.g., the second material).

For example, the leads may be doped to have a dopant concentration of about $10^{20}$ cm$^{-3}$, and the heating element may be doped to have a dopant concentration of about $10^{17}$ cm$^{-3}$. Further, the heating element may be formed to have a length of about 3.5 microns, and a width of about 2 microns.

FIGS. 6A-6D illustrates another exemplary aspect of the present invention. Specifically, FIGS. 6A-6D illustrates a memory cell 600 according to the exemplary aspects of the present invention.

The memory cell 600 includes at least one heater 601 including at least two leads 610a, 610b, and a heating element 620 which is formed between the at least two leads 610a, 610b and includes a material which is different from a material of the at least two leads 610a, 610b, such that a location of a hot spot in the heater 601 is controllable based on a polarity of current in the heater 601.

Figure 6C:
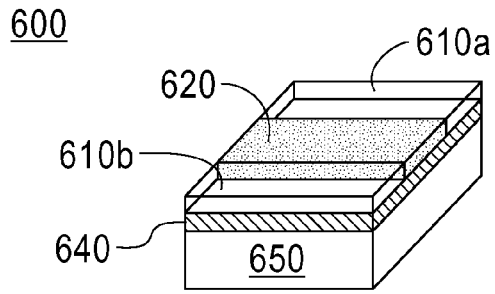
Figure 6C:
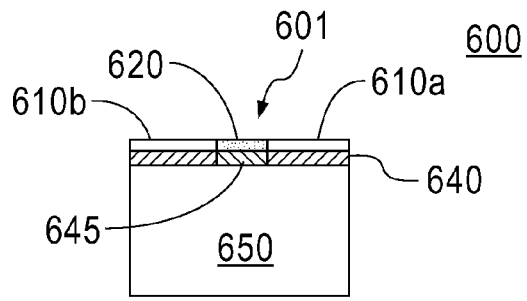
Figure 6C:
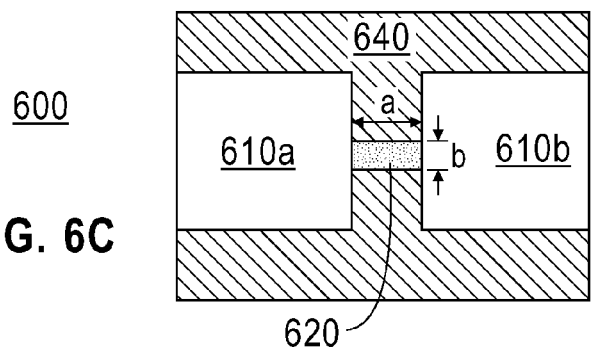
Figure 6D:
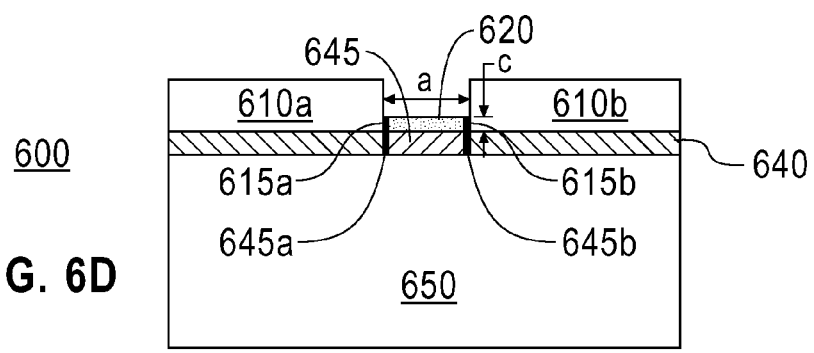

For example, as illustrated in FIG. 6D, for a given polarity, a hot spot may be formed near interface 615a, whereas for another polarity (e.g., the opposite polarity) instead of forming a hot spot near interface 615a, a hot spot may be formed near interface 615b. That is a location of the hot spot (e.g., near interface 615a or interface 615b) may be controlled by controlling a polarity of current in the heater 601.

The memory cell 600 may also include at least one storage medium 640 (e.g., phase-change storage medium) formed adjacent to the at least one heater 601. The storage medium 640 may include a region 645 formed adjacent to (e.g., directly beneath) the heating element 620 and also may include a region formed adjacent to (e.g., directly beneath) the leads 610a, 610b. Further, the memory cell 600 (e.g., the leads 610a, 620b, heating element 620 and storage medium 640) may be formed on a substrate 650 which may act as a heat sink.

As illustrated in FIG. 6C, the heating element 620 may have a length a, and a width b, the width b of the heating element 640 being equal to or less than the width of the leads 610a, 610b. As illustrated in FIG. 6D, the heating element 620 may also have a thickness c which is equal to or less than the thickness of the leads 610a, 610b.

Specifically, the memory cell 600 may have a structure (e.g., materials, etc.) which is similar to a structure of the memory cell as described in U.S. Patent Publication No. US20040188668A1. Depending on the polarity (e.g., direction) of the current applied to the heater 601, a heat spot formed near interface 615a can be utilized to program the thermal and/or electrical impedance of the memory cell 600, or a heat spot formed near interface 615b can be utilized to program the impedance.

As a result, at least two bits of information may be stored per memory cell. That is, the hot spot formed near interface 615a can be used to store a bit of information at information storage region 645a of the region 645, and the hot spot formed near interface 615b can be used to store a bit of information at information storage region 645b of the region 645.

In the memory cell 600, storage medium 640 may have a programmable thermal impedance (e.g., have a phase-dependent thermal conductivity), and the heater 620 (e.g., a resistive heater) may be in thermal communication with the storage medium 640 for programming the thermal impedance.

Specifically, the heater 601 may be used to process information (e.g., reading and/or writing and/or erasing) in the memory cell 600. In addition, the storage medium 640 may include a phase-change medium such as an amorphous/crystalline phase-change medium. The memory cell 600 may also include a substrate 650 on which the storage medium 640 is formed, and which may function as a heat sink.

Further, in the present invention the primary current path for reading and/or writing and/or erasing does not necessarily involve the phase-change media. That is, a reading and/or writing and/or erasing operation may be realized indirectly by the heater 601, which may be in thermal, but may not necessarily be in electrical contact with a phase-change media 640.

Specifically, the heater 601 can be used to heat the storage medium 640 so as to vary the thermal impedance of the medium 640. That is, the heater 601 may be controlled to program the impedance of the storage medium 640. Thus, the heater 601 may be capable of reading data from a storage medium 640 as well as writing data to the medium 640 and erasing data from the medium 640.

For reading, the heating element 620 may act as a sensor. Specifically, the heating element 620 may infer and/or measure the temperature of the heating element 620 as a function of the thermal impedance of the storage medium 640.

The present invention may also consider how the temperature differences for the amorphous and crystalline case are sensed (e.g., read). For example, the electrical resistance change of the heater as a function of temperature can be utilized to infer and/or measure the temperature of the heater and thereby read (e.g., detect, sense, etc.) the phase of the recording media.

In one aspect the heating element 620 and sensor (e.g., for a read operation) may be the same device. That is, the heating element 620 may be used to sense the thermal impedance of the phase-change material of the storage medium 640. In this case, it is preferred that the heating element 620 is formed of a material having a large temperature coefficient of resistance (TCR), such as a positor material (e.g., SiC, ceramics, oxides (e.g., $VO_2$) etc.) or semiconductor material, where temperature coefficients of several percent per degree can be obtained.

In addition, it may be preferred that the heating element 620 shares a large percentage of its surface area with the storage medium 640, in order to have good thermal conductance between the heating element 620 and the storage medium 640.

In principle, any kind of storage medium (e.g., phase change storage medium) can be used in the claimed invention. However, the storage medium should have a large difference in thermal impedances depending on the heating conditions. For example, the storage medium may include phase-change chalcogenide materials (e.g., GasSb, InSb, GaSeTe, AgInSbTe etc.) which are commonly used in compact disc and DVD applications. The storage medium may also include a conjugated organic material. In terms of thermal reading, low thermal conductivity materials (e.g., materials having a thermal conductivity less than 1 W/mK), as a storage medium may be preferred since they enhance the thermal reading contrast.

In addition, it is preferred that the programming via heating can be realized as fast as possible. Further, the storage medium 640 may include several distinguishable thermal/electrical impedance states making multidimensional (e.g., 2 or more bits) data storage possible for a given information storage region (e.g., regions 645a, 645b in FIG. 6D).

Further, the resistance of the lead(s) 610a, 610b should be minimized to avoid stray Joule heating of the phase-change media, and to enhance the reading contrast. The lead(s) 610a, 610b may also be thicker than the heating element 620 and include a different (e.g., lower resistivity) material (e.g. a metal such as copper or aluminum) than the heating element 620.

The substrate 650 may include a material which is a good heat sink. Such materials include silicon, metals, carbon etc. For example, the substrate 650 may include a laminate having different layers of materials. In some cases, non-electrical conductors are preferred in order to minimize dielectric breakdown through the storage medium.

Further, when a current is applied to the heating element, although the main current path is through the heating element 620, a stray current path which is parallel to the heating element 620 may exist in the storage medium 640. Therefore, if the storage medium 640 has an electrical impedance that is phase dependent (e.g., the storage medium has a programmable electrical impedance), the electrical resistance of the storage medium 640 to the stray current path may be used to determine phase of the storage medium 640 and thus, to determine an information state of the memory cell.

Figure 7:
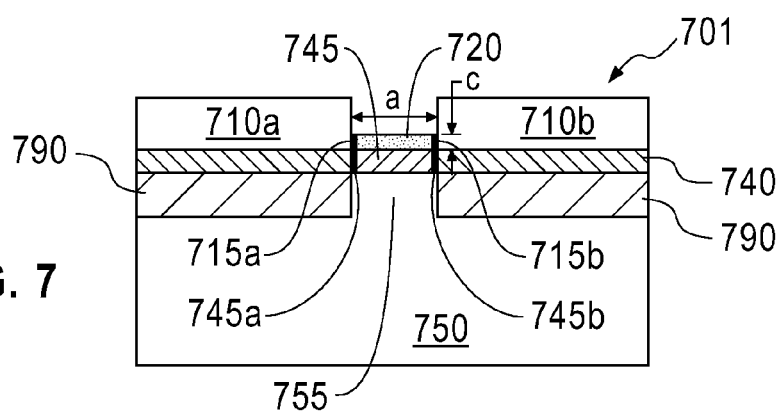
FIG. 7 illustrates a memory cell 700 according to another exemplary aspect of the present invention.

FIG. 7 illustrates a memory cell 700 according to another exemplary aspect of the present invention. The memory cell 700 includes a heater 701 including leads 710a, 710b and a heating element 720. Further, a material of the heating element 720 is different from a material of the leads 710a, 710b such that a location of a hot spot in the heater is controllable based on a polarity of current in the heater.

That is, for example, depending on the polarity of an electrical current in the heater 700, a hot spot may be formed near interface 715a, or alternatively near interface 715b. The memory cell 700 also includes a storage medium 740 which has a programmable electrical impedance and includes information storage regions 745a, 745b which may be formed near (e.g., directly beneath) interfaces 715a and 715b, respectively. The heating element 720 is in thermal communication with the storage medium 740 for programming the electrical impedance.

The memory cell 700 also includes a counter-electrode 755 which is in electrical communication with a region 745 of the storage medium 740. The counter-electrode 755 may be patterned out of the substrate 750. Portions of the storage medium 740 other than the region 745 may be formed on an insulator 790 which may be used to avoid stray electrical currents between lead(s) 710a, 710b and the counter-electrode 755. Specifically, the counter-electrode 755 may be surrounded by the insulator 790 which may include, for example, $SiO_2$. The electrical resistance of the counter-electrode 755 should be low in order to enhance the read contrast.

The electrical impedance of the storage medium 740 can be programmed by controlling the heater 701. That is, the heater 701 may heat the storage medium 740 to change the electrical impedance of the storage medium 740. Therefore, the heater 701 may be used for writing data to and/or erasing data from the storage medium 740.

Moreover, the heater 701 may be used (e.g., along with the counter-electrode 755) as an electrode to read data from the storage medium 740. Specifically, the counter-electrode (e.g., conductor) 755 may be used to detect the electrical impedance (e.g., resistance) of the storage medium 740, thereby facilitating a reading of the information stored in the storage medium 740. It should be noted that the main current path (e.g., for writing data to and/or erasing data from the storage medium 740) still does not involve the storage medium.

To perform a reading operation in this aspect, the present invention may utilize the electrical resistance change of the different phases of the storage medium 740. In this scheme, the heater 701 may act as one electrode for the read circuit, and a counter-electrode (e.g., conductor) 755 may be placed in thermal communication with (e.g., underneath) the storage medium 740. The counter-electrode 755 may also be patterned so that the current path for reading may include the region 745 of the storage medium 740 that is beneath the heating element 720.

Figure 8:
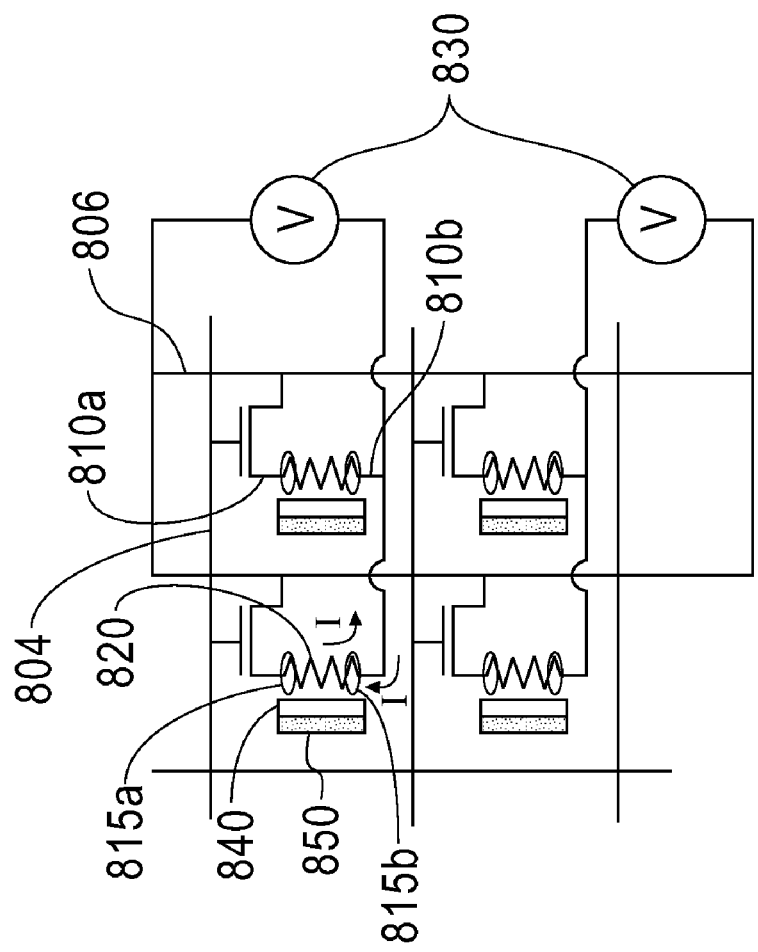
FIG. 8 illustrates a memory device 800 according to another exemplary aspect of the present invention.

Referring again to the drawings, FIG. 8 illustrates a memory device 800 according to another exemplary aspect of the present invention. The memory device 800 includes a plurality of memory cells according to the exemplary aspects of the present invention. The memory cells in the memory device 800 may be similar to memory cells 600, 700, and may include, for example, a heater having leads 810a, 810b and a heating element 820, a material of the heating element 820 being different from a material of the leads 810a, 810b such that a location of a hot spot in the heater is controllable based on a polarity of current in the heater. That is, for example, depending on the polarity of an electrical current in the heater, a hot spot may be formed near interface 815a, or alternatively near interface 815b. The memory cells may also include a storage medium 840 and a substrate 850.

The memory device 800 also includes a current source 830 (e.g., voltage source) electrically coupled to the plurality of memory cells, for generating a current in the heating element 820, the current including a first current and a second current have a polarity which is reversed from the first current. The arrows in FIG. 8 illustrate the possible direction of current, I, in the heating element 820 (e.g., resistor).

In addition, the memory cells may include a transistor 803 having a gate coupled to a wordline 804 for activating a row of memory cells, and an arm coupled to a bitline 806 for selecting a column of memory cells in the plurality of memory cells. Specifically, the current source 830 may be coupled to the bit line 806, such that the hot spot in the heater 820 may be moved, for example, between a location near interface 815a and a location near 815b, by changing the polarity of the current on the bitline.

As illustrated in FIG. 8, the heating element 820 may be implemented by a resistor (e.g., a metal resistor). The heating element 820 may also be implemented, for example, by doping a semiconductor (e.g., silicon wafer) appropriately.

Further, the heating element 820 is in thermal contact with a storage material 840, which can be written and/or erased and/or read using the heating element 820. More specifically, the wordline 804 may be used activate a row of memory cells via the gate of the transistors. The bitline 806 may be used to select a column of memory cells in the device 800. Depending on the polarity of the voltage on the bitline 806, heat can be generated between the leads and heating element near either interface 815a or interface 815b in the heater.

Figure 9:
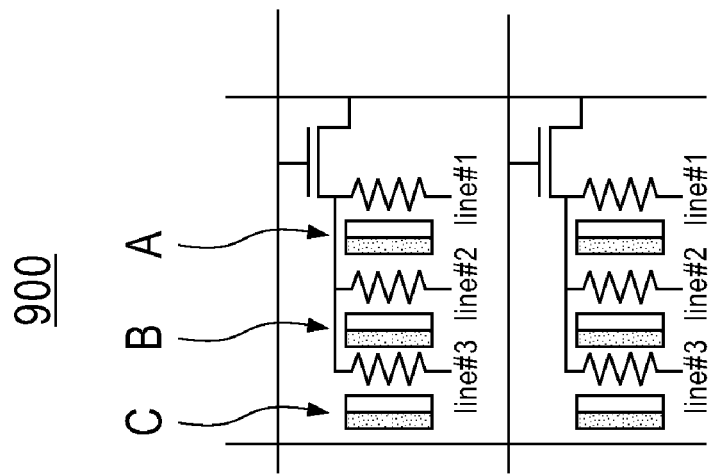
FIG. 9 illustrates a memory device 900 according to another exemplary aspect of the present invention.

FIG. 9 illustrates a memory device 900 according to another exemplary aspect of the present invention. The memory device 900 may be similar to the memory device 800. However, the memory cells in the memory device 900 may include a plurality of memory cell segments A, B and C associated therewith. The memory cell segments A, B and C may include (e.g., separately and independently include) a heater, storage medium and substrate (e.g., the segments may each have a structure similar to memory cell 600, 700). The segments A, B, and C may separately store two bits of information (e.g., based on a polarity of the current through the heater in the segments). That is, the memory cell in the device 900 may be used to store two bits of information for every segment included in the memory cell. Thus, for example, the memory cell in the device 900 includes three segments and may therefore store up to six bits of information.

That is, in addition to controlling the current polarity to activate a hot spot at one of two locations in the heaters, a segment A, B, C of the memory cell heater can be selected within the memory cell by controlling the voltages on the lines 1, 2, 3, respectively. For example to activate segment B (e.g., the second heater), the voltages on line 1 and 3 may be pulled to level of the voltage on line 2, and so on.

FIGS. 10A and 10B illustrate a recording head 1000 (e.g., thermal recording head) for a memory device or information storage device, according to another aspect of the present invention. The recording head 1000 may be implemented, for example, in a disc drive (e.g., hard disc drive) which is similar in form and function to a conventional magnetic hard disc drive.

The recording head 1000 includes at least one heater 1001 including at least two leads 1010a, 1010b, and a heating element 1020 which is formed between the at least two leads 1010a, 1010b, a material of the heating element 1020 being different from a material of the at least two leads 1010a, 1010b such that a location of a hot spot in the heater 1001 is controllable based on a polarity of current in the heater 1001. That is, for example, depending on the polarity of an electrical current in the heater 1001, a hot spot may be formed near interface 1015a, or alternatively near interface 1015b.

The recording head 1000 may be used to read data (e.g., bits of information) from and/or write data to and/or erase data from a recording medium 1040 (e.g., thermal phase-change recording medium). Specifically, the recording head 1000 could selectively generate a hot spot near interface 1015a to read data (e.g., bits of information) from and/or write data to and/or erase data from track 1040a on the recording medium 1040, and a hot spot near interface 1015b to read data (e.g., bits of information) from and/or write data to and/or erase data from track 1040b.

That is, a heater (e.g., a heater 100 illustrated in FIG. 1) according to the exemplary aspects of the present invention, may be embedded in the recording head 1000. The recording head 1000 could be used for thermal phase-change recording (e.g., reading, writing and/or erasing) while flying in nanometer distance (e.g., less than about 100 nm) over the recording medium 1040 (e.g., recording disc). Therefore, the recording head 1000 may be capable of reading, writing and/or erasing a plurality of tracks (e.g., two tracks per heater) in a very precise distance (e.g., about the distance separating the hot spots formed on the heater). For example, one track 1040a, 1040b on the recording disc 1040 could be a servo track using one of a hot spot formed near interface 1015a, while the hot spot formed near interface 1015b could be used for the actual data recording (e.g., reading, writing and/or erasing).

It should also be noted that this concept is not limited to one heater per recording head but that each junction of several heaters could be in principle controlled independently. That is, for example, the recording head could include two or more heaters according to the exemplary aspects of the present invention, such that the recording head may simultaneously read, write and or record data four or more tracks (e.g., at least two tracks per heater) on the recording disc.

For example, the recording head 1000 may be implemented in the form of a lever which is illustrated in FIG. 4A. In this case, the lever may include a silicon membrane having a thickness of about 0.5 microns (500 nm), and the dimension of each of the heating elements 401, 402 may be about 3.5 to 4 microns in length, by about 2 microns in width. Further, the leads may be highly doped (e.g., about $2\times10^{20}$ cm$^{-3}$) with dopant ions (e.g., phosphorus ions) while the heating element may be slightly doped (e.g., about $5\times10^{17}$ cm$^{-3}$) with the same or different dopant ions. For example, the heater 401 (e.g., reader) may be used to read data from the storage medium 1040, and the heater 402 (e.g., writer) may include a "tip" formed on the foremost end of the heating element 420, and may be used to write data to a storage medium 1040.

With its unique and novel features, the present invention provides a heater (e.g., and memory cell, memory device and recording head) having a heating element with a plurality of hot spots which are controllable (e.g., controlled) based on a polarity of current in the heating element.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

The invention claimed is:

1. A heater, comprising:
   at least two leads; and
   a heating element which is formed between said at least two leads, a material of said heating element being different from a material of said at least two leads such that a location of a hot spot in said heater is controllable based on a polarity of current in said heater,
   wherein said material of said heating element comprises a Seebeck coefficient which is different than a Seebeck coefficient of said material of said at least two leads.

2. The heater of claim 1, wherein said material of said heating element and said material of said at least two leads comprise a doped semiconductor, a dopant concentration in said material of said heating element being different than a dopant concentration in said material of said at least two leads.

3. The heater of claim 2, wherein said dopant concentration of said material of said at least two leads is greater than a dopant concentration of said material of said heating element.

4. The heater of claim 2, wherein said doped semiconductor comprises a doped silicon membrane having a thickness of about 0.5 microns.

5. The heater of claim 1, wherein where said polarity comprises a first polarity, said hot spot is formed at an interface between said heating element and one of said at least two leads, and where said polarity comprises a second polarity different from said first polarity, said hot spot is formed at an interface between said heating element and another one of said at least two leads.

6. The heater of claim 1, wherein a location of said hot spot is moved from an interface between said heating element and one of said at least two leads, to another interface between said heating element and another one of said leads by changing said polarity of said current in said heater.

7. The heater of claim 1, wherein said at least two leads are connected to a current source which generates a first current and a second current having a polarity which is reversed from said first current.

8. The heater of claim 1, wherein a length of said heating element is about 3.5 microns, and a width of said heating element is about 2 microns.

9. The heater of claim 1, wherein said at least two leads comprises a doped silicon membrane with a dopant concentration of about $10^{20}$ cm$^{-3}$, and said heating element comprises a doped silicon membrane with a dopant concentration of about $10^{17}$ cm$^{-3}$.

10. A method of fabricating a heater, said method comprising:
    forming at least two leads; and
    forming a heating element between said at least two leads, a material of said heating element being different from a material of said at least two leads such that a location of a hot spot in said heater is controllable based on a polarity of current in said heater,
    wherein said material of said heating element comprises a Seebeck coefficient which is different than a Seebeck coefficient of said material of said at least two leads.

* * * * *